United States Patent

Huang

Patent Number: 5,089,361
Date of Patent: Feb. 18, 1992

[54] MASK MAKING PROCESS

[75] Inventor: Dong T. Huang, Hsichu, Taiwan

[73] Assignee: Industrial Technology Research Institute, Hsinchu, Taiwan

[21] Appl. No.: 568,946

[22] Filed: Aug. 17, 1990

[51] Int. Cl.$^5$ ............................ G03F 1/00; G03F 7/26
[52] U.S. Cl. ....................................... 430/5; 430/314; 430/316; 430/318; 430/323; 430/324; 156/643; 156/656; 156/659.1; 156/904
[58] Field of Search ................... 430/5, 314, 316, 317, 430/318, 323, 324, 325, 327, 329; 156/643, 656, 659.1, 904

[56] References Cited

U.S. PATENT DOCUMENTS

| | | | |
|---|---|---|---|
| 3,715,244 | 2/1973 | Szupillo | 430/5 |
| 3,729,316 | 4/1973 | Castrucci et al. | 430/5 |
| 4,363,846 | 12/1982 | Kaneki | 430/5 |
| 4,489,146 | 12/1984 | Bock et al. | 430/5 |

*Primary Examiner*—Charles L. Bowers, Jr.
*Assistant Examiner*—Kathleen Duda
*Attorney, Agent, or Firm*—George O. Saile

[57] ABSTRACT

A method for making lithographic masks using a soda lime glass substrate that is useful particularly in the manufacture of near submicron and submicron integrated circuits. The problem of "mouse nipping" at the edges of the chromium metal and chromium oxide mask lines is overcome by using a very thin high molecular weight coating under the standard resist layer and over the chromium oxide layer.

14 Claims, 1 Drawing Sheet

MASK MAKING PROCESS

BACKGROUND OF THE INVENTION

1. Field of the Invention

The present invention relates to a method for the manufacturing lithographic masks using a soda glass substrate that is useful in the manufacture of integrated circuits.

2. Description of the Prior Art

There continues to be an ever dramatic increase in the complexity of integrated circuits each year. As applications develop for memories, microprocessors and minicomputers there is and increasing demand for greater complexities, higher switching speeds, and smaller devices in the integrated circuits.

As a result of these greater complexities and smaller devices, there are greater demands in the lithographic masks that must be used to make these advanced integrated circuits. This puts strains upon the existing technologies of mask making. A major example is in the making of a chromium metal and chromium oxide mask on a substrate of soda lime glass. Now that line widths are becoming very narrow and may be one micron or even submicron in width, problems are seen in the sharpness of the lines and shapes produced by the resist masking and etching of the chromium oxide and chromium metal. A phenomenon which may be termed "mouse nipping" becomes a serious problem at these narrow line widths when soda lime glass is used as the mask substrate. It is believed that the cause of this problem is due to Na+ migration from the soda lime glass substrate to the chromium oxide and resist interface. A serious adhesion problem results and the sharpness of the lines and shapes are lost.

The problem of continuity of the narrow lines and shapes can be overcome by use of more expensive quartz or other specialized glass substrates which have a purity that will not result in a migration of ions and adhesion problems. However, these types of substrates are much more expensive and have other limitations.

SUMMARY OF THE INVENTION

It is therefore the object of this invention to provide a solution to the problem of line and shape lack of sharpness when very narrow mask line features are made using the chromium oxide and chromium metal on soda lime glass substrate.

In accordance with the present invention, a method is used to manufacture lithographic masks supported upon a soda glass substrate useful in the manufacture of narrow line width integrated circuits. The method provides sharp line and shape masks when micron and even submicron features are formed in the masks. The soda lime glass substrate is cleaned and otherwise prepared for subsequent processing. A thin layer of chromium metal is deposited upon the substrate. A thin chromium oxide layer is formed on the chromium metal. A very thin coating of a high molecular weight resist material in the order of more than 50 to several hundreds of Angstoms in thickness is formed over the chromium oxide layer and the coating is dried. A layer of resist material is applied over the thin coating and the resist layer is dried. The layer of resist material is exposed to radiant energy in the desired pattern of the lithographic mask to be made and the pattern is developed in the resist. The lithographic pattern is then etched in the chromium oxide and chromium metal layers using the resist pattern as the mask. The resist pattern is removed and the resulting micron or even submicron featured mask has sharpness in its lines and shapes.

DETAILED DESCRIPTION OF THE PREFERRED EMBODIMENTS

Figure 1:
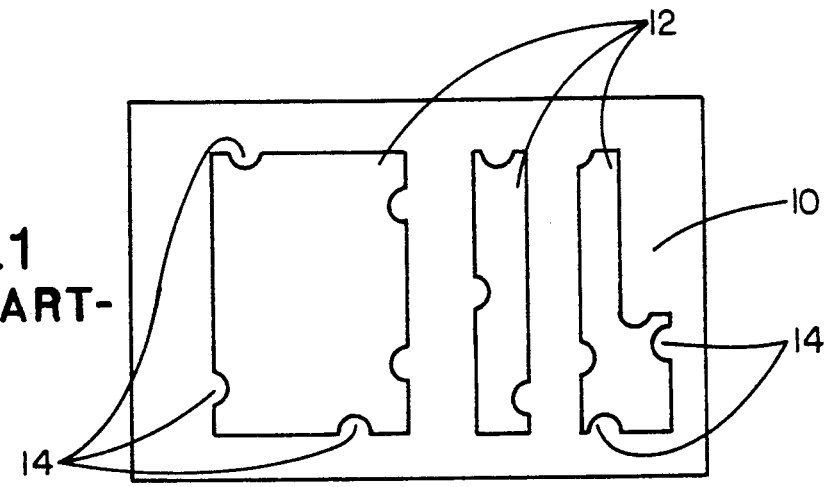
FIG. 1 illustrates the Prior Art problem involving line continuity when narrow mask features of a micron or less are formed in chromium oxide and chromium metal on a soda lime substrate.

Referring now more particularly to FIG. 1, there is shown the resulting top view of a mask formed by the conventional process of making a chromium lithography mask upon a soda lime substrate where narrow line width dimensions are involved. The process involves cleaning the soda lime glass substrate 10 in preparation for the deposition of chromium metal as is well known in the prior art. Chromium metal is blanket deposited on the substrate 10 by sputtering, evaporation or the like that has a thickness of the order of between about 700 to 1000 Angstroms with the preferred thickness of about 800 Angstroms. A chromium oxide layer is deposited by sputtering to a thickness between about 200 to 400 Angstroms. However, it is alternatively possible to form this layer of chromium oxide by either chemical vapor deposition or thermal oxidation. This completes the chromium and chromium oxide layered structure 12.

A resist layer (not shown) is now formed upon the structure 10, 12. This layer may be a positive or negative resist material. Preferred materials are the positive photoresist materials such as phenolformaldehyde resins (novolak) with a diazonaphtoquinone sensitizer. Advantageous examples for these positive resist materials are those marketed by Shipley Co. Inc., Newton, Mass., U.S.A. under the trade names Hochest AZ-1350 H, Hochest AZ-1350 J, S-1400, and Hochest AZ-1450 B. The resist layer is spin coated upon the layered substrate 10, 12. The resist is exposed by suitable radiation in the desired pattern using a master mask and developed in accordance with standard lithography practices. The pattern is now etched in the layer 12 using ceric ammonium nitrate in perchloric acid solution or an solution of acetic acid, nitric acid and ceric ammonium nitrate.

The result of the etching step is shown schematically in FIG. 1. The resulting narrow line widths and shapes have been formed in the layer 12 of chromium metal and chromium oxide and we can see the "mouse nipping" 14. This phenomena is unacceptable for these micron or submicron line dimensions that are now used in integrated circuit production today and in the future. It is believed that it is the migration of sodium ions from the soda lime glass substrate to the interface between layer 12 and the resist layer which causes the etching process to attack the layer 12 in this way.

Figure 2:
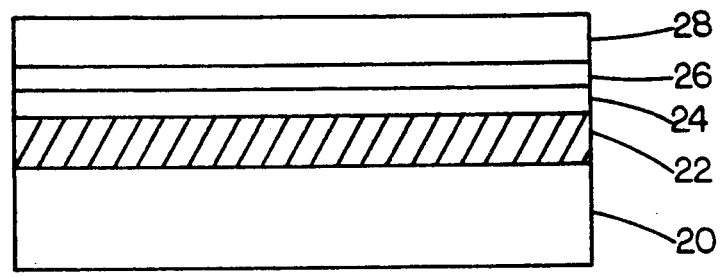
FIGS. 2 through 4 illustrate in vertical cross-section the process of the present invention.
Figure 3:
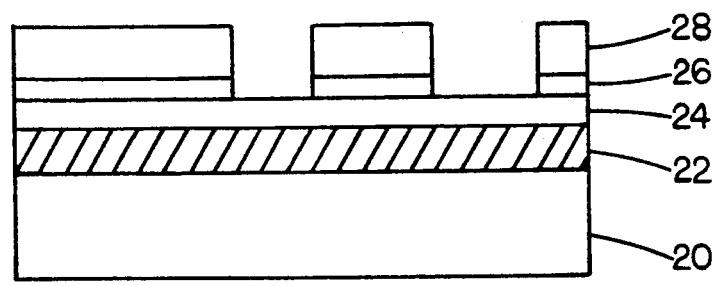
Figure 4:
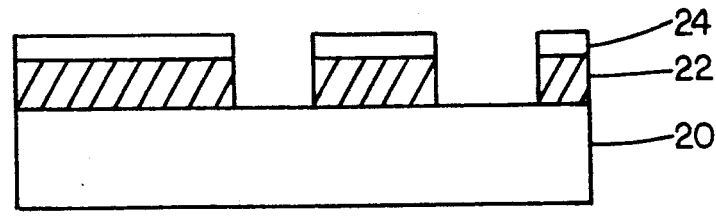

Referring now to FIGS. 2 through 4, a process for overcoming the FIG. 1 Prior Art problems is described. A standard soda lime glass mask substrate 20 is used. The process begins by cleaning the soda lime glass substrate 10 in preparation for the deposition of chromium metal as is well known in the prior art. Typically the substrate is cleaned, rinsed with ultrasonic activated deionized water and then rinsed again in deionized water. A chromium metal layer 22 is now deposited upon the glass substrate 20 by sputtering, evaporation or the like that has a thickness of the order of about 700 to 1000 Angstroms. A chromium oxide film 24 is now formed upon the chromium metal layer 22 by sputtering as is well known in the art. Alternatively, as in the FIG. 1 such a chromium oxide can be formed by chemical vapor deposition or by thermal oxidation.

A very thin coating 26 of a high molecular weight material in the order of hundreds of Angstroms in thickness is applied onto the chromium oxide film 24. The preferred thickness of the thin coating is between about 50 to 500 in Angstroms. Typical of the materials that are useful are polymers having a molecular weights more than about 10,000 and preferably of 100,000 to 500,000 and which are used as resist materials. Examples of these materials which have proven successful in experiments are polybutyl sulfone and poly (glycidyl methacrylate) Co poly (ethyl acrylate) which is generally known as COP. The very thin coating is obtained by thinning the material in a vehicle such as chlorobenzene for COP or methyl isobutyl ketone for the polybutyl sulfone at a dilution of one part high molecular weight material to fifty parts vehicle and spin coating the layer upon layer 24. The thin coating is then dried of its vehicle to produce the coating 26 as seen in FIG. 2.

A resist layer 28 is now formed upon the very thin coating 26. The layer 28 may be a positive or negative resist material. Preferred materials are the same as were listed in the Prior Art process description above. The resist layer is preferred to be a positive photoresist material such as phenolformaldehyde resins (novolak) with a diazonaphtoquinone sensitizer. The resist layer is formed by spin coating upon the layered substrate as is known in the art. The resist is exposed by suitable radiation such as light, electron beam energy, X-ray or the like in the desired pattern using a master mask and developed in accordance with standard lithography practices. The pattern is now etched in the thin coating 26, chromium oxide film 24 and chromium metal 22 by either ceric ammonium nitrate in perchloric acid solution or a solution of acetic acid, nitric acid and ceric ammonium nitrate to produce the FIG. 3 structure.

The very thin coating 26 and resist 28 mask are now removed by sulfuric acid and hydrogen peroxide solution, or an alkali such as sodium hydroxide or the like. Other removal solutions are also possible. The results in the FIG. 4 vertical cross-sectional mask structure that does not have the "mouse nipping" defects of the Prior Art as seen in the FIG. 1 standard process.

While the invention has been particularly shown and described with reference to the preferred embodiments thereof it will be understood by those skilled in the art that various changes in form and details may be made without departing from the spirit and scope of the inventions.

What is claimed is:

1. A method for manufacturing a lithographic mask supported upon a soda lime glass substrate useful in the manufacture of narrow line widths integrated circuits comprising:

preparing a soda lime glass substrate for subsequent processing;

depositing a thin layer of chromium metal upon said substrate;

forming a thin chromium oxide layer upon the said chromium metal;

applying a very thin coating of a high molecular weight material of the group consisting of poly (glycidyl methacrylate) Co poly (ethyl acrylate) and poly butyl sulfone in the order of hundreds of Angstroms in thickness over the chromium oxide layer;

drying the coating;

applying a layer of resist material over said thin coating and drying said layer of resist material;

exposing said layer of resist material and said very thin coating to radiant energy in the desired pattern of said lithographic mask and developing pattern;

using the said pattern in the developed said resist to etch said very thin coating and said layers of said chromium oxide and chromium metal to form said lithographic mask; and removing said resist material and said thin coating to complete the said lithographic mask.

2. The method of claim 1 wherein the very thin coating has a molecular weight of more than about 10,000.

3. The method of claim 1 wherein said very thin coating of high molecular weight material is deposited by diluting said material in at least 50 parts to 1 solvent to material, depositing the mixture upon said chromium oxide, spinning and drying it of solvent to form said coating.

4. The method of claim 1 wherein said very thin coating of high molecular weight material has a thickness of between about 50 and 500 Angstroms.

5. The method of claim 1 wherein said radiant energy is electron beam energy.

6. The method of claim 1 wherein the said radiant energy is X-ray energy.

7. The method of claim 1 wherein said resist material is a positive resist and includes phenolformaldehyde resin.

8. The method of claim 1 wherein the said etch of said chromium oxide and chromium metal layers is ceric ammonium nitrate in perchloric acid solution.

9. The method of claim 1 wherein the said etch of said chromium oxide and chromium metal layers is a solution of acetic acid, nitric acid and ceric ammonium nitrate.

10. The method of claim 1 wherein the thickness of the chromium metal is between about 700 to 1000 in Angstroms.

11. The method of claim 10 wherein the thickness of the chromium oxide is between about 200 to 400 in Angstroms.

12. The method of claim 1 wherein the said pattern is submicron in dimensions and the soda lime glass substrate has sodium ions therein.

13. The method of claim 1 wherein the chromium oxide is formed by baking the chromium metal in air at an elevated temperature.

14. The method of claim 1 wherein the chromium oxide is formed by sputtering.

* * * * *